(12) United States Patent
Moore (10) Patent No.: US 6,653,184 B2
(45) Date of Patent: Nov. 25, 2003

(54) METHOD OF FORMING TRANSISTORS ASSOCIATED WITH SEMICONDUCTOR SUBSTRATES COMPRISING FORMING A NITROGEN-COMPRISING REGION ACROSS AN OXIDE REGION OF A TRANSISTOR GATE

(75) Inventor: John T. Moore, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/951,307

(22) Filed: Sep. 12, 2001

(65) Prior Publication Data

US 2002/0006736 A1 Jan. 17, 2002

Related U.S. Application Data

(62) Division of application No. 09/602,395, filed on Jun. 22, 2000.

(51) Int. Cl.[7] .......................................... H01L 21/8238
(52) U.S. Cl. ..................... 438/216; 438/287; 438/591; 438/770; 438/776
(58) Field of Search ................................ 438/216, 275, 438/287, 585, 592, 595, 763, 770, 775, 776, 792, 591

(56) References Cited

U.S. PATENT DOCUMENTS

| 4,605,447 | A | 8/1986 | Brotherton et al. |
|---|---|---|---|
| 5,026,574 | A | 6/1991 | Economu et al. |
| 5,032,545 | A | 7/1991 | Doan et al. |
| 5,254,489 | A | 10/1993 | Nakata |
| 5,258,333 | A | 11/1993 | Shappir |
| 5,330,920 | A | 7/1994 | Soleimani et al. |
| 5,334,554 | A | 8/1994 | Lin et al. |
| 5,378,645 | A | 1/1995 | Inoue et al. |
| 5,382,533 | A | 1/1995 | Ahmad et al. |
| 5,436,481 | A | 7/1995 | Egawa et al. |
| 5,445,999 | A | 8/1995 | Thakur et al. |
| 5,464,792 | A | 11/1995 | Tseng et al. |
| 5,500,380 | A | 3/1996 | Kim |
| 5,518,946 | A | 5/1996 | Kuroda |
| 5,596,218 | A | 1/1997 | Soleimani et al. |

(List continued on next page.)

FOREIGN PATENT DOCUMENTS

WO  WO 96/39713  12/1996

OTHER PUBLICATIONS

Wolf, S., "Silicon Processing for the VLSI Era", Lattice Press 1990, vol. 2, pp. 212–213.

(List continued on next page.)

*Primary Examiner*—Carl Whitehead, Jr.
*Assistant Examiner*—Stephen W. Smoot
(74) *Attorney, Agent, or Firm*—Wells St. John P.S.

(57) ABSTRACT

The invention encompasses a method of forming an oxide region over a semiconductor substrate. A nitrogen-containing layer is formed across at least some of the substrate. After the nitrogen-containing layer is formed, an oxide region is grown from at least some of the substrate. The nitrogen of the nitrogen-containing layer is dispersed within the oxide region. The invention also encompasses a method of forming a pair of transistors associated with a semiconductor substrate. A substrate is provided. A first region of the substrate is defined, and additionally a second region of the substrate is defined. A first oxide region is formed which covers at least some of the first region of the substrate, and which does not cover any of the second region of the substrate. A nitrogen-comprising layer is formed across at least some of the first oxide region and across at least some of the second region of the substrate. After the nitrogen-comprising layer is formed, a second oxide region is grown from the second region of the substrate. A first transistor gate is formed over the first oxide region, and a second transistor gate is formed over the second oxide region.

8 Claims, 4 Drawing Sheets

U.S. PATENT DOCUMENTS

| | | | |
|---|---|---|---|
| 5,612,558 A | 3/1997 | Harshfield | |
| 5,619,057 A | 4/1997 | Komatsu | |
| 5,620,908 A | 4/1997 | Inoh et al. | |
| 5,633,036 A | 5/1997 | Seebauer et al. | |
| 5,663,077 A | 9/1997 | Adachi et al. | |
| 5,674,788 A | 10/1997 | Wristers et al. | |
| 5,685,949 A | 11/1997 | Yashima | |
| 5,716,864 A | 2/1998 | Abe | |
| 5,719,083 A | 2/1998 | Komatsu | |
| 5,760,475 A | 6/1998 | Cronin | |
| 5,763,922 A * | 6/1998 | Chau | 257/371 |
| 5,834,372 A | 11/1998 | Lee | |
| 5,837,592 A | 11/1998 | Chang et al. | |
| 5,837,598 A | 11/1998 | Aronowitz et al. | |
| 5,840,610 A | 11/1998 | Gilmer et al. | |
| 5,861,651 A | 1/1999 | Brasen et al. | |
| 5,885,877 A | 3/1999 | Gardner et al. | |
| 5,939,750 A | 8/1999 | Early | |
| 5,960,289 A * | 9/1999 | Tsui et al. | 438/275 |
| 5,960,302 A | 9/1999 | Ma et al. | |
| 5,970,345 A | 10/1999 | Hattangady et al. | |
| 5,972,783 A | 10/1999 | Arai et al. | |
| 5,972,800 A | 10/1999 | Hasegawa | |
| 5,994,749 A | 11/1999 | Oda | |
| 5,998,253 A | 12/1999 | Loh et al. | |
| 6,033,998 A | 3/2000 | Aronowitz et al. | |
| 6,054,396 A | 4/2000 | Doan | |
| 6,057,220 A | 5/2000 | Ajmera et al. | |
| 6,080,629 A | 6/2000 | Gardner et al. | |
| 6,080,682 A | 7/2000 | Ibok | |
| 6,087,229 A | 7/2000 | Aronowitz et al. | |
| 6,091,109 A | 7/2000 | Hasegawa | |
| 6,091,110 A | 7/2000 | Herbert et al. | |
| 6,093,661 A | 7/2000 | Trivedi et al. | |
| 6,110,780 A | 8/2000 | Yu et al. | |
| 6,110,842 A | 8/2000 | Okuno et al. | |
| 6,114,203 A | 9/2000 | Ghidini et al. | |
| 6,136,636 A | 10/2000 | Wu | |
| 6,140,187 A | 10/2000 | DeBusk et al. | |
| 6,146,948 A | 11/2000 | Wu et al. | |
| 6,174,821 B1 | 1/2001 | Doan | |
| 6,184,110 B1 | 2/2001 | Ono et al. | |
| 6,197,701 B1 | 3/2001 | Shue et al. | |
| 6,207,532 B1 | 3/2001 | Lin et al. | |
| 6,207,586 B1 | 3/2001 | Ma et al. | |
| 6,225,167 B1 * | 5/2001 | Yu et al. | 438/275 |
| 6,228,701 B1 | 5/2001 | Dehm et al. | |
| 6,232,244 B1 | 5/2001 | Ibok | |
| 6,255,703 B1 | 7/2001 | Hause et al. | |
| 6,268,296 B1 | 7/2001 | Misium et al. | |
| 6,274,442 B1 | 8/2001 | Gardner et al. | |
| 6,297,162 B1 | 10/2001 | Jang et al. | |
| 6,323,114 B1 | 11/2001 | Hattangady et al. | |
| 6,331,492 B2 | 12/2001 | Misium et al. | |
| 6,399,448 B1 | 6/2002 | Mukhopadhyay et al. | |
| 6,410,991 B1 | 6/2002 | Kawai et al. | |
| 6,413,881 B1 | 7/2002 | Aronowitz et al. | |
| 6,436,771 B1 | 8/2002 | Jang et al. | |
| 6,450,116 B1 | 9/2002 | Noble et al. | |
| 6,482,690 B2 | 11/2002 | Shibata | |
| 6,492,690 B2 | 12/2002 | Ueno et al. | |
| 2003/0034518 A1 | 2/2003 | Yoshikawa | |

OTHER PUBLICATIONS

Wolf, S., "Silicon Processing for the VLSI Era", Lattice Press 1990, vol. 2, pp. 188–189, 194–195, 609–614.

Ko, L. et al., "The Effect of Nitrogen Incorporation into the Gate Oxide by Using Shallow Implantation of Nitrogen and Drive–In Process", IEEE 1996, pp. 32–35, in Processeds of 1998 Electron Devices Meeting.

Doyle, B. et al., "Simultaneous Growth of Different Thickness Gate Oxides in Silicon CMOS Processing", IEEE Electron Device Letters, vol. 16, No. 7, Jul. 1995, pp. 301–302.

Kuroi, T. et al., "The Effects of Nitrogen Implantation Into P+Poly–Silicon Gate on Gate Oxide Properties", 1994 Sympos. on VLSI Technology Digest of Technical Papers, IEEE 1994, pp. 107–108.

Liu, C.T. et al., "Multiple Gate Oxide Thickness for 2GHz System–on–a–Chip Technologies", IEEE 1998, IEDM Technical Digest, Dec. 1998, pp. 589–592.

* cited by examiner

METHOD OF FORMING TRANSISTORS ASSOCIATED WITH SEMICONDUCTOR SUBSTRATES COMPRISING FORMING A NITROGEN-COMPRISING REGION ACROSS AN OXIDE REGION OF A TRANSISTOR GATE

RELATED PATENT DATA

This patent is a divisional application of U.S. patent application Ser. No. 09/602,395 which was filed on Jun. 22, 2000.

TECHNICAL FIELD

The invention pertains to methods of forming oxide regions over semiconductor substrates, and in particular embodiments pertains to methods of forming two or more transistors associated with a semiconductor substrate.

BACKGROUND OF THE INVENTION

Oxide regions, such as, for example, silicon dioxide regions, have numerous applications in semiconductor devices. For instance, a thin layer of silicon dioxide is frequently placed between the conductive material of a transistor gate and an underlying semiconductor substrate, with such layer of silicon dioxide frequently being referred to as so-called "gate oxide". The thickness of the gate oxide can affect various electrical properties of a transistor structure incorporating the gate oxide, and accordingly it is desired to control the gate oxide thickness during device fabrication.

Transistor devices which are commonly used in semiconductor assemblies are PMOS transistor devices and NMOS transistor devices. Each type of transistor device has particular electrical properties associated therewith, and accordingly there can be advantages in utilizing different gate oxide structures for some of the transistor devices associated with a semiconductor structure relative to others of the transistor devices associated with a semiconductor structure.

In light of the importance of gate oxide structures in semiconductor device fabrication, it is desired to develop new methods for forming oxide regions associated with semiconductor structures.

SUMMARY OF THE INVENTION

In one aspect, the invention encompasses a method of forming an oxide region over a semiconductor substrate. A nitrogen-containing layer is formed across at least some of the substrate. After the nitrogen-containing layer is formed, an oxide region is grown from at least some of the substrate. The nitrogen of the nitrogen-containing layer is dispersed within the oxide region.

In another aspect, the invention encompasses a method of forming a pair of transistors associated with a semiconductor substrate. A substrate is provided. A first region of the substrate is defined, and additionally a second region of the substrate is defined. The first region is a p-type doped region, and the second region is an n-type doped region. A first oxide region is formed which covers at least some of the first region of the substrate, and which does not cover any of the second region of the substrate. A nitrogen-comprising layer is formed across at least some of the first oxide region and across at least some of the second region of the substrate. After the nitrogen-comprising layer is formed, a second oxide region is grown from the second region of the substrate. A first transistor gate is formed over the first oxide region, and a second transistor gate is formed over the second oxide region. First source/drain regions are formed proximate the first transistor gate to form a PMOS transistor comprising the first transistor gate. Second source/drain regions are formed proximate the second transistor gate to form an NMOS transistor comprising the second transistor gate.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
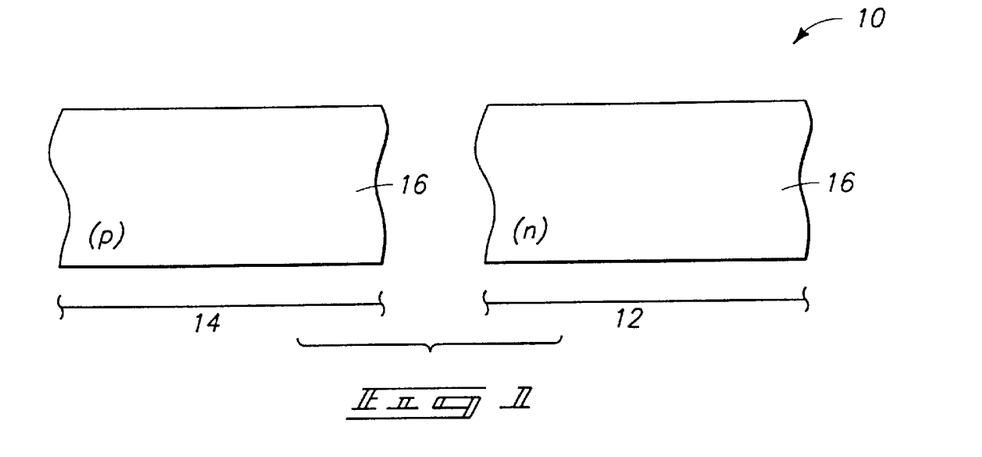
FIG. 1 is a diagrammatic, cross-sectional view of fragments of a semiconductor wafer shown at a preliminary processing step of the present invention.

A semiconductor wafer 10 is shown in fragmentary view in FIG. 1, and specifically is shown to comprise a first fragmentary region 12 and a second fragmentary region 14. Wafer 10 comprises a substrate 16. Substrate 16 can, for example, comprise a bulk semiconductive material, such as, for example, monocrystalline silicon lightly doped with a background p-type dopant. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Regions 12 and 14 can correspond to differently-doped regions of substrate 16. For instance, region 12 can correspond to a portion of substrate 16 having a heavier concentration of n-type conductivity enhancing dopant than p-type conductivity enhancing dopant, and can accordingly be referred to as an n-type doped region. Further, region 14 can correspond to a region of substrate 16 wherein the p-type dopant concentration is heavier than any n-type dopant concentration, and can accordingly be referred to as a p-type region of substrate 10. In order to emphasize this aspect of the invention and assist in the description that follows, substrate 16 of region 12 is labeled with an "n", and region 14 is labeled with a "p". It is to be understood that the shown doping of regions 12 and 14 corresponds to a particular embodiment of the present invention, and that other embodiments are encompassed wherein both of regions 12 and 14 are similarly doped, including embodiments wherein regions 12 and 14 are both heavier doped with n-type dopant than p-type dopant, as well as embodiments wherein regions 12 and 14 are both heavier doped with p-type dopant than n-type dopant.

In particular embodiments of the present invention, regions 12 and 14 correspond to portions of a semiconductor memory assembly, and in such embodiments regions 12 and 14 can both correspond to memory array regions, or can both correspond to regions peripheral to a memory array region, or alternatively one of regions 12 and 14 can correspond to a memory array region while the other regions 12 and 14 corresponds to a portion of the wafer peripheral to the memory array region.

Figure 2:
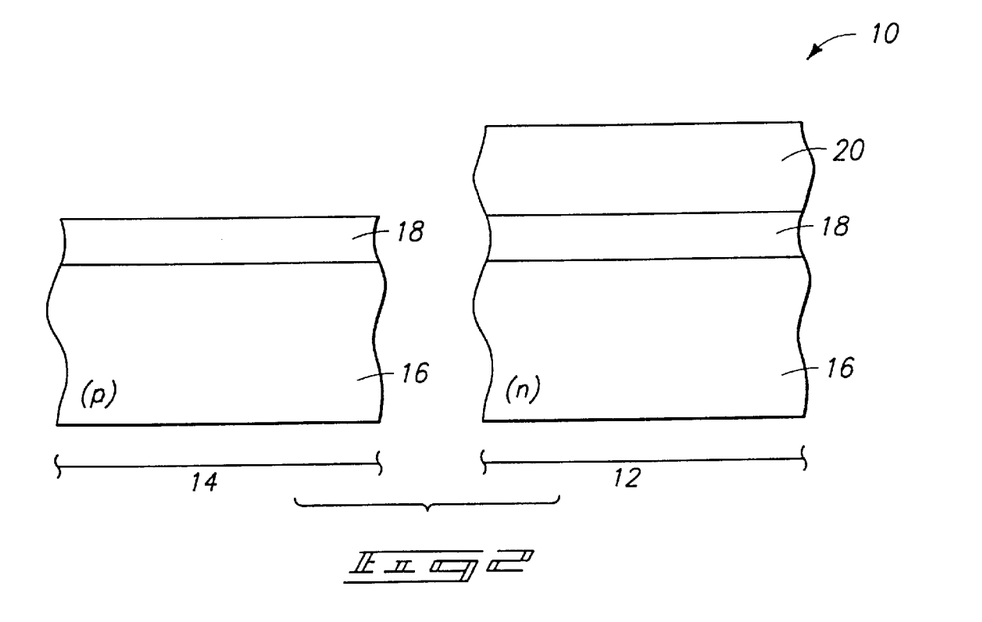
FIG. 2 is a view of the FIG. 1 fragments shown at a processing step subsequent to that of FIG. 1.

Referring to FIG. 2, an oxide layer 18 is formed over substrate 16. Oxide 18 is shown formed over both of regions 12 and 14. Oxide layer 18 can comprise, for example, silicon dioxide, and can be formed by, for example, chemical vapor deposition over substrate 16. Alternatively, oxide layer 18 can be formed by exposing substrate 16 to oxidizing conditions. For instance, if substrate 16 comprises monocrystalline silicon, a silicon dioxide layer 18 can be formed by oxidizing a surface of substrate 16. Oxide layer 18 is preferably formed to a thickness of less than 70 Å, and can be formed to a thickness of less than or equal to about 50 Å, such as, for example, a thickness of about 30 Å.

A patterned masking layer 20 is shown formed over oxide layer 18 to mask the portion of oxide layer 18 in region 12, while leaving the portion of oxide layer 18 of region 14 exposed. Masking layer 20 can comprise, for example, photoresist, and can be patterned by photolithographic processing. Although masking layer 20 is shown covering an entirety of oxide 18 of region 12, and not covering any of oxide 18 of region 14, it is to be understood that the invention encompasses other embodiments wherein masking layer 20 covers only a portion of oxide 18 over region 12, and further encompasses embodiments wherein masking layer 20 also covers a portion of oxide layer 18 of region 14.

Figure 3:
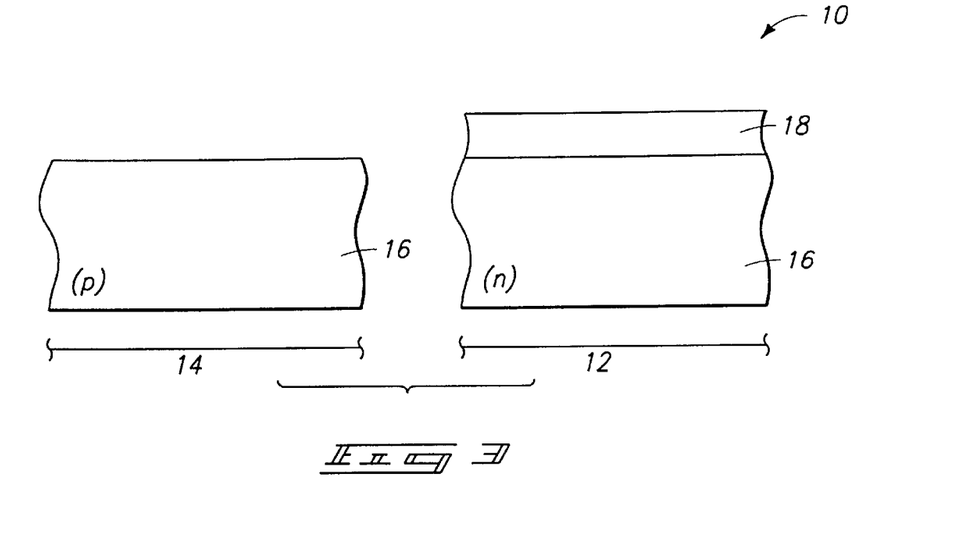
FIG. 3 is a view of the FIG. 1 wafer fragments shown at a processing step subsequent to that of FIG. 2.

Referring to FIG. 3, the exposed portion of oxide 18 of region 14 is removed. Such can be accomplished by, for example, exposing wafer 10 to hydrofluoric acid. Masking layer 20 (FIG. 2) protects oxide 18 from being exposed to the oxide-removing etchant, and accordingly oxide 18 remains over region 12 after removal of oxide 18 from region 14.

It is to be understood that the processing of FIGS. 2 and 3 is but if one exemplary method of forming the structure shown in FIG. 3, and that other methods are encompassed by the present invention. In any event, the structure corresponding to FIG. 3 is preferably ultimately formed, with such structure having oxide 18 covering at least some of region 12 of substrate 16, and not covering at least some of region 14 of substrate 16.

Figure 4:
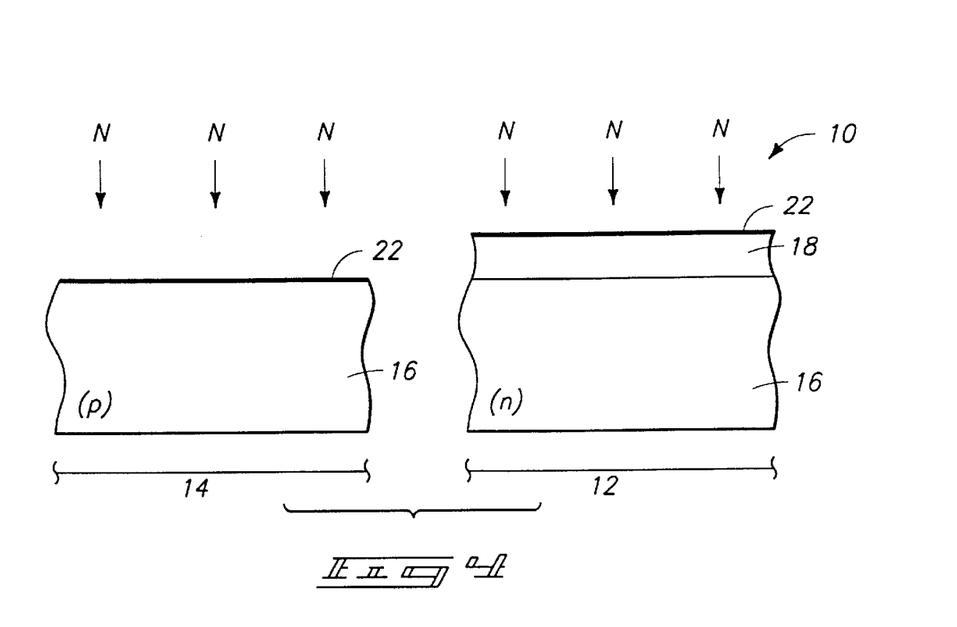
FIG. 4 is a view of the FIG. 1 wafer fragments shown at a processing step subsequent to that of FIG. 3.

Referring to FIG. 4, a nitrogen-comprising layer 22 is formed over regions 12 and 14. More specifically, nitrogen-comprising layer 22 is formed on and/or within at least some of oxide layer 18 of region 12, and further is formed on and/or within at least some of substrate 16 of region 14. Nitrogen-comprising layer 22 is preferably kept within a surface region of oxide 18 of region 12, and also within a surface region of substrate 16 of region 14. For purposes of interpreting this disclosure and the claims that follow, a surface region is defined to be a region which extends to no more than 10 Å beneath a surface, and in particular embodiments nitrogen-comprising region 22 extends no more than 5 Å beneath an upper surface of either substrate 16 of region 14 or oxide 18 of region 12.

Figure 7:
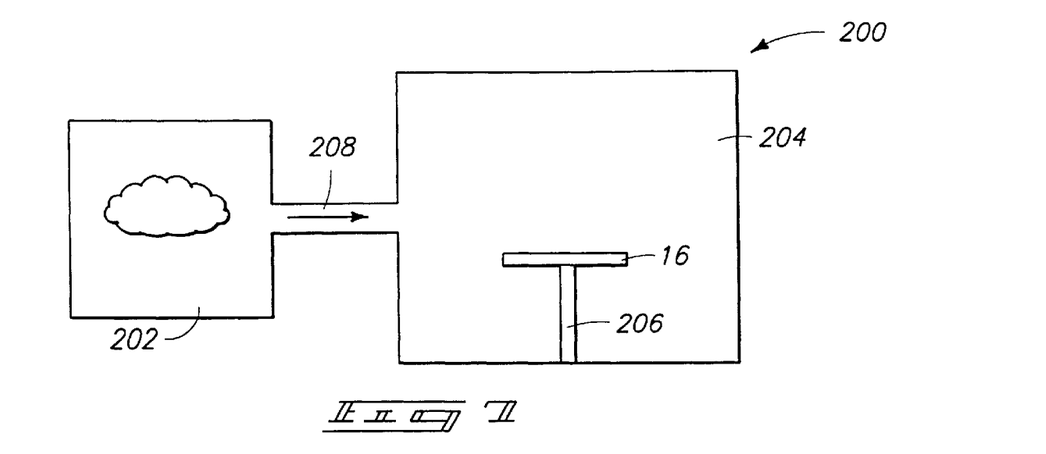
FIG. 7 is a diagrammatic, schematic, cross-sectional view of an exemplary remote plasma nitridation apparatus which can be utilized in methodology of the present invention.

Nitrogen-comprising region 22 can be formed by, for example, remote plasma nitridization utilizing, for example, an apparatus 200 described with reference to FIG. 7. Apparatus 200 comprises a plasma chamber 202 and a reaction chamber 204. Reaction chamber 204 comprises a substrate holder 206, and substrate 16 is supported within chamber 204 by holder 206. Preferably, holder 206 is configured to rotate substrate 16 during exposure of substrate 16 to activated nitrogen species. Such activated nitrogen species are formed within plasma chamber 202 by, for example, exposing $N_2$ and/or other nitrogen-containing materials (for example, $N_2O$ and/or $NH_3$) to plasma conditions, with the term "activated" indicating that the nitrogen species is different than the form of nitrogen fed to the plasma. An activated nitrogen species can comprise, for example, a nitrogen ion or a nitrogen atom in an energy state higher than its ground state. Exemplary plasma conditions comprise utilization of a microwave plasma generator at a power of from about 1,500 watts to about 3,000 watts, and a pressure within chamber 202 of less than or equal to about 3 Torr.

The plasma of chamber 202 forms activated nitrogen species which migrate along a passageway 208 into chamber 204 whereupon the species can form nitrogen-comprising layer 22 (FIG. 4) over substrate 16. An arrow is shown within passageway 208 to indicate migration of plasma activated nitrogen species through passageway 208.

Preferably, passageway 208 is of sufficient length so that plasma 202 is at least about 12 inches from substrate 16. Such can enable highly activated nitrogen species formed within a plasma to relax prior to interaction with substrate 16, which can limit penetration of the nitrogen species into substrate 16 relative to an amount of penetration which would occur with more highly activated species. In order to further limit penetration of nitrogen species into substrate 16, substrate 16 is preferably not biased relative to the plasma within chamber 202.

Suitable operating conditions for forming a nitrogen-comprising plasma over substrate 16 can include maintaining a temperature of substrate 16 at from about 550° C. to about 1,000° C., rotating the wafer at about 90 rotations per minute (RPM), maintaining a pressure within chambers 202 and 204 of from about 0.8 Torr to about 2.8 Torr, and exposing the wafer to the nitridization conditions for a time of from about one minute to about five minutes.

Figure 8:
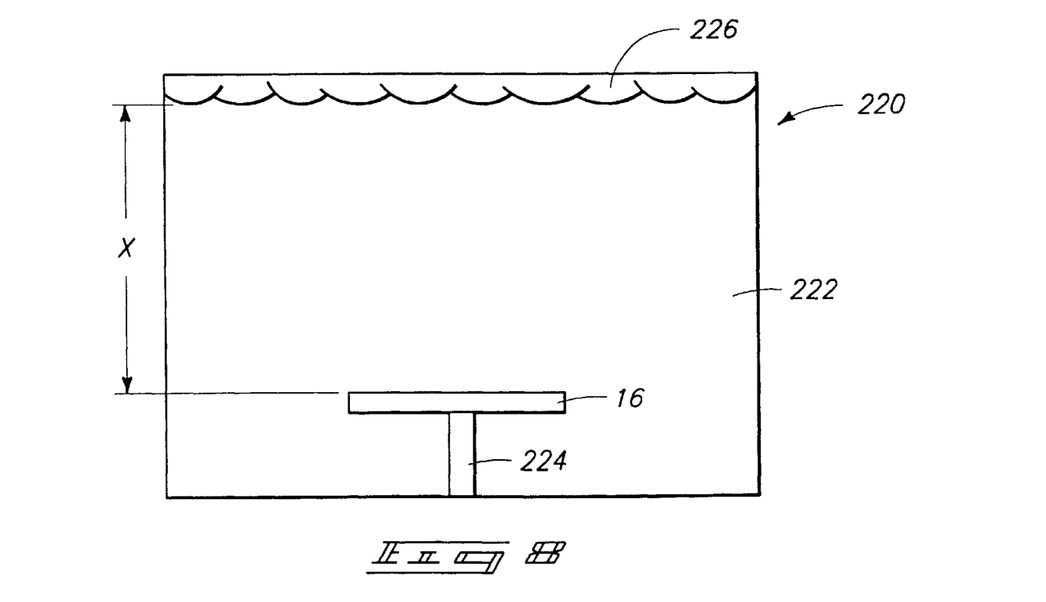
FIG. 8 is a diagrammatic, cross-sectional view of another apparatus which can be utilized in methodology of the present invention.

An alternative apparatus which can be utilized for forming nitrogen-comprising layer 22 (FIG. 4) is described with reference to FIG. 8 as apparatus 220. Apparatus 220 can be referred to as a high density plasma remote plasma nitridization (HDP-RPN) apparatus, or simply as a plasma nitridization (PN) apparatus. Apparatus 220 comprises a reaction chamber 222 having a wafer holder 224 therein. Wafer 16 is supported on holder 224. A plasma 226 is formed above substrate 16, and preferably is maintained a distance "X" from substrate 16, with distance "X" corresponding to at least about four inches. Nitrogen is introduced into plasma 226 in the form of, for example, $N_2$, and activated nitrogen species are formed from the nitrogen. Suitable processing parameters for utilization of the apparatus of FIG. 8 include a wafer temperature of from 0° C. to 400° C., no rotation of the wafer, a pressure within chamber 222 of from about 5 mTorr to about 15 mTorr (preferably of from about 5 mTorr to about 10 mTorr), and an exposure time of substrate 16 to activated nitrogen species within chamber 222 of from about 5 seconds to about 30 seconds.

Figure 5:
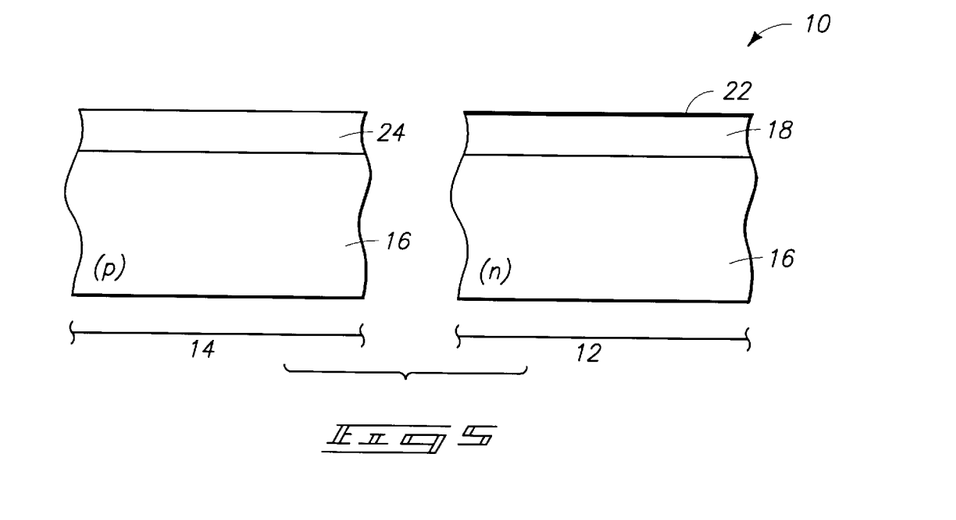
FIG. 5 is a view of the FIG. 1 wafer fragments shown at a processing step subsequent to that of FIG. 4.

Referring next to FIG. 5, substrate 10 is shown at a processing step subsequent to that of FIG. 4, and specifically is shown after exposure to oxidizing conditions. The oxidizing conditions grow an oxide layer 24 from region 14 of substrate 16. The portion of nitrogen-comprising layer 22 previously over region 14 (FIG. 4) is dispersed within oxide 24, and preferably becomes sufficiently dispersed so that the nitrogen does not significantly affect performance characteristics of the oxide in devices incorporating the oxide. Suitable processing forms oxide layer 24 to be at least about 70 Å thick. Such processing is found to adequately distribute nitrogen of the previous layer 22 that had been associated with region 14 so that oxide layer 24 can be incorporated as a gate oxide in transistor devices.

It is noted that nitrogen-comprising layer 22 over oxide 18 of region 12 substantially slows further oxidation of substrate 16 within region 12, and accordingly oxide grows faster over region 14 than over region 12. Thus, oxide 24 is formed to be thicker than the oxide 18 over region 12. Further, nitrogen-comprising layer 22 associated with region 12 remains substantially intact and it can be utilized as, for example, a dopant barrier layer for devices subsequently formed over region 12. In particular aspects of the present invention, the oxidation of wafer 10 forms oxide layer 24 to be at least about 70 Å thick, and oxide layer 18 remains less than or equal to about 50 Å thick.

Figure 6:
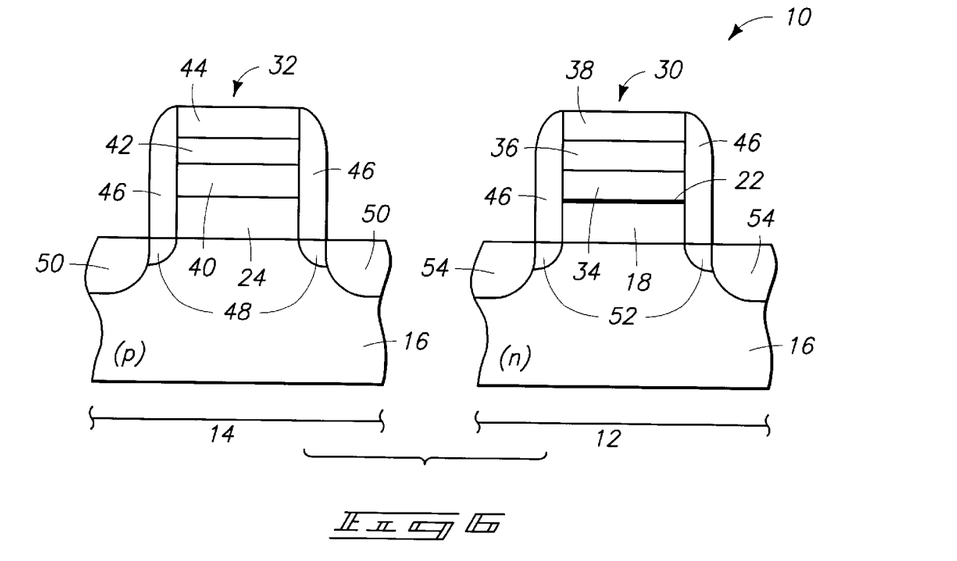
FIG. 6 is a view of the FIG. 1 wafer fragments shown at a processing step subsequent to that of FIG. 5.

Referring to FIG. 6, transistor devices 30 and 32 are formed to be associated with regions 12 and 14, respectively. Devices 30 and 32 comprise oxide layers 18 and 24 as gate oxide, respectively. Device 30 further comprises layers 34, 36 and 38 patterned over oxide 18, and device 32 further comprises layers 40, 42 and 44 patterned over oxide layer 24.

Referring to device 30, layers 34 and 36 can comprise, for example, conductive materials such as, for example, conductively doped silicon and metal silicide, respectively; and layer 38 can comprise, for example, an insulative cap, such as, for example, a silicon nitride cap. Transistor device 30 can comprise a PMOS device, and conductively doped silicon layer 34 can comprise p-type doped polysilicon. Nitrogen-comprising layer 22 can function as a barrier layer to impede migration of p-type dopant from layer 34 into substrate 16. It is noted that the portion of substrate 16 under oxide layer 18 is an n-type channel for PMOS device 30. Accordingly, if p-type dopant migrates from layer 34 into substrate 16, it can alter dopant concentrations within the n-type channel, and affect or destroy operation of device 30.

Referring to device 32, layers 40, 42 and 44 can comprise, for example, conductively doped silicon, metal silicide, and an insulative cap, respectively. Conductively doped silicon 40 can comprise, for example, n-type doped polysilicon, and metal silicide 42 can comprise, for example, titanium silicide or tungsten silicide. Insulative cap 44 can comprise, for example, a silicon nitride cap. Device 32 corresponds to an NMOS transistor device.

Conductive layers 40 and 42 form a gate for device 32, and conductive layers 34 and 36 form a gate for device 30. Sidewall spacers 46 are shown formed along sidewalls of the gates of devices 30 and 32. Layers 34, 36, 38, 40, 42 and 44, as well as sidewall spacers 46, can be formed by conventional methods.

Lightly doped diffusion regions 48 are shown formed within substrate 16 and proximate a channel region of device 32, and heavily doped source/drain regions 50 are also shown formed within substrate 16 and associated with device 32. The gate defined by conductive materials 40 and 42 gatedly connects the source/drain regions 50 with one another. Source/drain regions 50 and LDD regions 48 can be formed by conventional methods, and source/drain regions 50 can be heavily doped with n-type conductivity enhancing dopant as is typical for an NMOS device 32.

Lightly doped diffusion regions 52 are shown formed within region 12 of substrate 16 and heavily doped source/drain regions 54 are also shown within region 12 of substrate 16, and shown associated with device 30. A transistor gate defined by conductive layers 34 and 36 gatedly connects source/drain regions 54 with one another. Source/drain regions 54 can be heavily doped with p-type dopant as is typical for a PMOS transistor device 30.

Lightly doped diffusion regions 48 and 52 would typically be lightly doped with n-type conductivity enhancing dopant and p-type conductivity enhancing dopant, respectively. The term "lightly doped" is used to indicate that the diffusion regions 48 and 52 are more lightly doped than are source/drain regions 50 and 54. Typically, source/drain regions 50 and 54 would be doped to a concentration of at least about $10^{19}$ atoms/cm$^3$ with conductivity enhancing dopant.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming a pair of transistors associated with a semiconductor substrate, comprising:
    defining a first region and a second region of the substrate, the first region being an n-type doped region and the second region being a p-type doped region;
    forming a first oxide region which covers at least some of the first region of the substrate and which does not cover any of the second region of the substrate;
    forming a nitrogen-comprising layer across at least some of the first oxide region and across at least some of the second region of the substrate;
    after forming the nitrogen-comprising layer, growing a second oxide region from the second region of the substrate, the second oxide region having a thickness of at least about 70 Å;
    forming a first transistor gate over the first oxide region and a second transistor gate over the second oxide region;
    forming first source/drain regions proximate the first transistor gate to form a PMOS transistor comprising the first transistor gate; and
    forming second source/drain regions proximate the second transistor gate to form an NMOS transistor comprising the second transistor gate.

2. The method of claim 1 wherein the PMOS transistor gate comprises p-type doped silicon, and wherein the nitrogen-containing layer formed over the first oxide region prevents p-type dopant migration from the doped silicon to the first substrate region.

3. The method of claim 1 wherein the second oxide region is grown to be thicker than the first oxide region.

4. The method of claim 1 wherein the nitrogen-comprising layer is formed by remote plasma nitridation utilizing nitrogen species generated in a plasma that is at least about 12 inches from the substrate.

5. The method of claim 1 wherein the nitrogen-comprising layer is formed by plasma nitridation utilizing nitrogen species generated in a plasma that is at least about 4 inches from the substrate.

6. A method of forming a pair of transistors associated with a semiconductor substrate, comprising:

defining a first region and a second region of the substrate, the first region being a n-type doped region and the second region being an p-type doped region;

forming a first oxide region which covers at least some of the first region of the substrate and which does not cover any of the second region of the substrate;

forming a first nitrogen-comprising region across at least some of the first oxide region and a second nitrogen-comprising region across at least some of the second region of the substrate, the second nitrogen-comprising region extending less than or equal to about 10 Å beneath an upper surface of the second region of the substrate;

after forming the first and second nitrogen-comprising regions, growing a second oxide region from the second region of the substrate, the second oxide region having a thickness of at least about 70 Å, the nitrogen from the second nitrogen-comprising region being dispersed within the second oxide region during the growing; and forming a first transistor gate over the first oxide region and a second transistor gate over the second oxide region, the second oxide region functioning as a gate oxide in the second transistor gate.

7. The method of claim 6 wherein the second nitrogen-comprising region extends no more than 5 Å beneath the upper surface of the second region of the substrate.

8. The method of claim 6 wherein after growing the second oxide region, the first oxide region comprises a thickness of less than or equal to about 50 Å.

\* \* \* \* \*

UNITED STATES PATENT AND TRADEMARK OFFICE
CERTIFICATE OF CORRECTION

PATENT NO. : 6,653,184 B2
DATED : November 25, 2003
INVENTOR(S) : Moore

It is certified that error appears in the above-identified patent and that said Letters Patent is hereby corrected as shown below:

Title page,
Item [56], References Cited, U.S. PATENT DOUCUMENTS, insert:
-- 6,362,085 B1  3/2002   Yu et al.
5,164,331 A    11/1992  Lin et al.
5,318,924 A    6/1994   Lin et al.
5,449,631 A    9/1995   Giewont et al.
5,518,958 A    5/1996   Giewont et al.
6,201,303 B1   3/2001   Ngo et al.
6,399,445 B1   6/2002   Hattangady et al. --

Column 3,
Line 54, delete "if".

Signed and Sealed this

Sixth Day of July, 2004

JON W. DUDAS
*Acting Director of the United States Patent and Trademark Office*